United States Patent
Goossen

(10) Patent No.: US 6,996,151 B1
(45) Date of Patent: Feb. 7, 2006

(54) TIN OXIDE ADHESION LAYER FOR METAL-DIELECTRIC MIRRORS

(75) Inventor: Keith Wayne Goossen, Aberdeen, NJ (US)

(73) Assignee: Lucent Technologies Inc., Murray Hill, NJ (US)

(*) Notice: Subject to any disclaimer, the term of this patent is extended or adjusted under 35 U.S.C. 154(b) by 0 days.

(21) Appl. No.: 09/435,668

(22) Filed: Nov. 8, 1999

(51) Int. Cl.
*H01S 5/00* (2006.01)

(52) U.S. Cl. ...................... 372/92; 372/45.01
(58) Field of Classification Search ............ 372/92, 372/45; 359/838, 839, 850; 438/605, 608, 438/609, 635
See application file for complete search history.

(56) References Cited

U.S. PATENT DOCUMENTS

| | | | | |
|---|---|---|---|---|
| 3,806,779 A | * | 4/1974 | Uekusa et al. ............ 257/443 |
| 4,990,972 A | * | 2/1991 | Satoh et al. .................. 257/94 |
| 5,071,206 A | * | 12/1991 | Hood et al. .................. 359/360 |
| 5,318,651 A | * | 6/1994 | Matsui et al. ............ 156/273.3 |
| 5,514,485 A | * | 5/1996 | Ando et al. .................. 428/702 |
| 5,524,092 A | * | 6/1996 | Park ........................... 257/295 |
| 5,631,315 A | * | 5/1997 | D'Errico ..................... 524/314 |
| 5,780,174 A | * | 7/1998 | Tokito et al. ............... 428/690 |
| 5,959,762 A | * | 9/1999 | Bandettini et al. .......... 359/265 |
| 6,185,241 B1 | * | 2/2001 | Sun ............................... 372/96 |
| 6,449,093 B2 | * | 9/2002 | Hebrink et al. ............. 359/497 |
| 6,552,367 B1 | * | 4/2003 | Hsieh et al. .................. 257/94 |

* cited by examiner

*Primary Examiner*—Minsun Oh Harvey
*Assistant Examiner*—Phillip Nguyen

(57) ABSTRACT

A mirror of known type comprises a stack of pairs of dielectric material layers of alternating high and low refractive indices and a metal layer, preferably gold, capping one end of the stack. For improvising the adherence of the metal layer to the stack, the metal is directly contiguous with a layer of tin oxide. In different mirror structures, the tin oxide can be an extra layer added between the end-most pair of layers and the metal layer; or the tin oxide layer can comprise one layer of only the end-most pair of dielectric layers in the stack; or all of the pairs of dielectric layers in the stack can comprise a layer of tin oxide as one of the pair layers.

11 Claims, 2 Drawing Sheets

TIN OXIDE ADHESION LAYER FOR METAL-DIELECTRIC MIRRORS

BACKGROUND OF THE INVENTION

This invention relates to mirrors, and particularly to mirrors comprising stacked pairs of transparent dielectric layers capped by a reflective layer of metal, particularly gold.

One type of known mirror, particularly useful for multiple light reflections within semiconductor lasers, comprises a stack of contiguous layers of transparent material where the successive layers alternate between high and low refractive indices of light, e.g., odd numbered layers being of a high refractive index while even numbered layers are of low refractive index. At each interface between layers of different refractive indices, some amount of reflection of a beam of light directed at the mirror occurs, with the remainder of the light beam being transmitted through the stack for partial reflection at successive interfaces. For a mirror designed for use with light of a given frequency, all the layers are a quarter wavelength thick (as measured within the layers), and all the light reflected from successive interfaces is exactly in phase where the reflected light beam exits the front of the mirror. The greater the number of pairs of layers (each pair providing in-phase reflections), the greater is the total amount of light reflected and, conceptually, 100% reflectivity could be reached with a sufficient number of pairs. Some light is absorbed in the layers, however, and a peaking of light reflectivity occurs with increasing numbers of pairs. Substantially 100% reflectivity can be obtained, however (or a reduction in the number of pairs for a given reflectivity), by capping or backing the stack with a low optical loss metal layer such as gold, silver, copper or aluminum.

A problem with the use of these metals, and particularly gold and silver, is that they do not adhere well to known dielectric materials heretofore used in mirror stacks. The present invention significantly overcomes this problem.

SUMMARY OF THE INVENTION

A mirror comprising a stack of pairs of contiguous dielectric layers of high and low refractive indices terminates in a layer of tin oxide capped by a layer of metal, preferably gold.

In one embodiment, each pair of layers in the stack comprises a first layer of a priorly used dielectric layer, e.g., cryolite, of low refractive index contiguous with a layer of tin oxide of high refractive index. The capping layer of metal is contiguous with the layer of tin oxide of the last pair of dielectric layers in the stack.

In a second embodiment, all layers in the mirror stack, other than the last pair of layers, comprise pairs of priorly used dielectric materials, e.g., a layer of cryolite of low refractive index contiguous with a layer of zinc sulfide of high refractive index. The last stack pair, in this example, comprises a layer of cryolite contiguous with a layer of tin oxide capped, in turn, by a layer of metal.

In a third embodiment, the entire mirror stack is in accordance with priorly known mirror stacks, i.e., with all pairs of dielectric materials of the stack comprising priorly used dielectric materials, but with a layer of tin oxide disposed between a capping layer of metal and the second layer of the last stack pair of layers.

DESCRIPTION OF THE DRAWINGS

The drawings are schematic and not to scale.

FIG. 1 also showing, by virtue of a change of material of one of the device portions, a first embodiment of the invention.

DESCRIPTION OF PREFERRED EMBODIMENTS OF THE INVENTION

Figure 1:
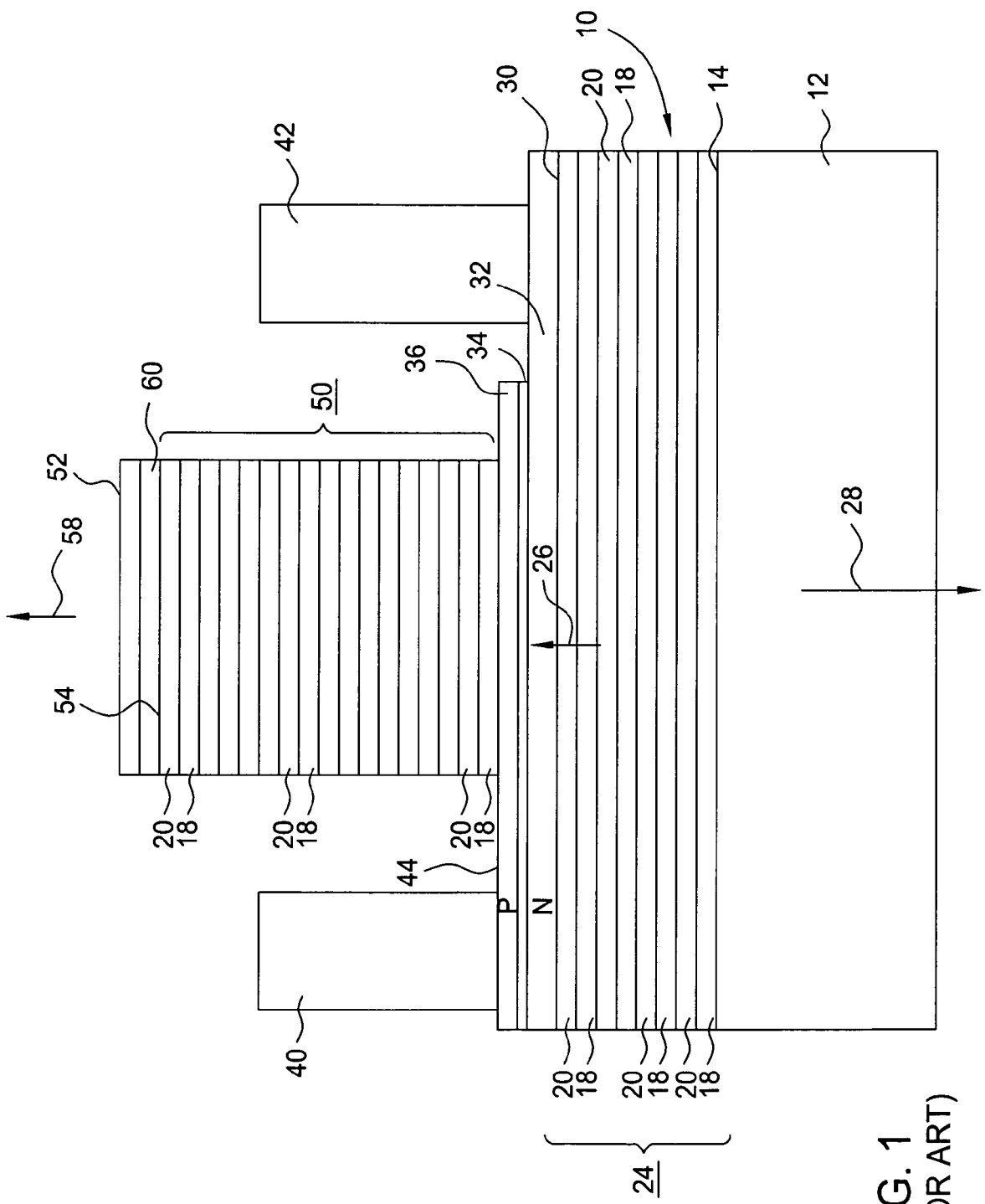
FIG. 1 is a side elevational view of certain internal portions of a known type of semiconductor laser device.

An example of a known optical device 10 using known mirrors is shown in FIG. 1. The device is a vertical-cavity, surface emitting laser (VCSEL) comprising a substrate 12 of a semiconductor material, e.g., GaAs, having a plurality of successively deposited layers on a surface 14 thereof. The first (in this example) eight layers shown comprise four pairs of layers 18 and 20 of the materials GaAs and AlAs. The two layers 18 and 20 of each pair have different refractive indices, and the four pairs of layers 18 and 20 comprise a double ended "lower" mirror 24 for providing light reflection in the upper direction (shown by arrow 26) and light transmission in the lower direction 28 (through and outwardly from the substrate 12).

The lower mirror upper surface 30 is covered with a semiconductor light emitter comprising three layers, 32, 34 and 36 of GaAs, where the bottom layer 32 is of N type conductivity, the top layer 36 is of P type conductivity, and the middle ("gain") layer 34 is undoped. By biasing the P layer 36 positive relative to the N layer 32, current is caused to flow through the middle layer 34 (from an electrode 40 contacting the P layer 36 to an electrode 42 contacting the N layer 32) which causes, as known, the emission of light within the layer 34 and transmission of light vertically outwardly from both layers 32 and 36.

Mounted on the upper surface 44 of the P layer 36 is a stack 50 of (in this example) eighteen layers comprising nine pairs of layers 18 and 20 of the materials cryolite and zinc sulfide (not the same as in stack 24). The nine pair stack 50 also constitutes a mirror, but of the single ended type, that is, the upper end 54 of the stack is capped with a layer 52 of metal for maximum reflectivity and no light transmission in the upward direction 58. As previously noted, different metals, such as gold, silver, copper and aluminum, are used as capping layers but, in general, gold is the preferred material owing to superior optical performance and high chemical inertness. A problem with the use of such metals (generally less so with aluminum) is that they tend to be poorly adherent to known dielectric materials used in mirror stacks of the type shown in FIG. 1. In a priorly known attempt to improve the adherence of the metal capping layer 52 to the top end 54 of the stack 50, a layer 60 of sapphire is disposed between the top-most layer 20 of the stack 50 and the metal layer 52.

While some improvement in adhesion results, i.e., in comparison with the metal layer 52 being in direct contact with the stack top-most layer 20, the failure rate of devices over time owing to delamination of the metal from the stack is excessively high.

In accordance with one embodiment of the invention, an improvement in adhesion of the metal layer 52 in the stack shown in FIG. 1 is obtained by direct replacement of the sapphire layer 60 shown in FIG. 1 with a layer of tin oxide.

The use of layers of tin oxide in devices other than mirror stacks is known, and known processes can be used for applying tin oxide layers for use in mirror stacks in accordance with this invention.

In one test, layers of tin oxide (SnO) were deposited on a GaAs substrate at approximately 2 A°/sec using electron beam heating of a source material of stoichiometric tin oxide ($SnO_2$). Then, various metal capping metals, e.g., gold and copper, were deposited by resistive heating of source materials on respective tin oxide layers. For comparison, the metal capping layers were also deposited on typical dielectric layers used in mirror stacks, e.g., silicon monoxide, silicon dioxide, and titanium dioxide. A standard test for adhesion was performed on the various samples; namely, they were subjected to two minutes in an ultrasonic bath and the degree of delamination of the capping layers was noted. Significantly, less delamination occurred with the metal layers adhered to the tin oxide layers.

While all possible layers useful as capping layers were not tested, based upon experience, the technical literature and the limited tests actually made, it is expected that, in general, and particularly with chemically "pure" (stoichiometric) tin oxide ($SnO^2$) layers prepared using standard commercially available apparatus, improved adhesion over what was heretofore available is obtained using, in accordance with the invention, a tin oxide layer for adhering a metal capping layer to the end of a mirror stack of dielectric layers.

Additionally, of the various metals used for capping purposes, the preferred metal, owing to its superior optical performance and chemical inertness, is gold. Actual testing clearly revealed that excellent adhesion of gold is obtained by adhering it to a layer of tin oxide.

As previously noted, a common practice for improving the adhesion of a metal capping layer is the use of an intermediate layer of sapphire. In accordance with one embodiment of the invention, the sapphire layer 60 shown (in FIG. 1) is simply replaced with a layer of tin oxide having the same optical thickness as the replaced sapphire layer. The optical thickness of any material film is the physical thickness divided by the refractive index of the material.

Figure 2:
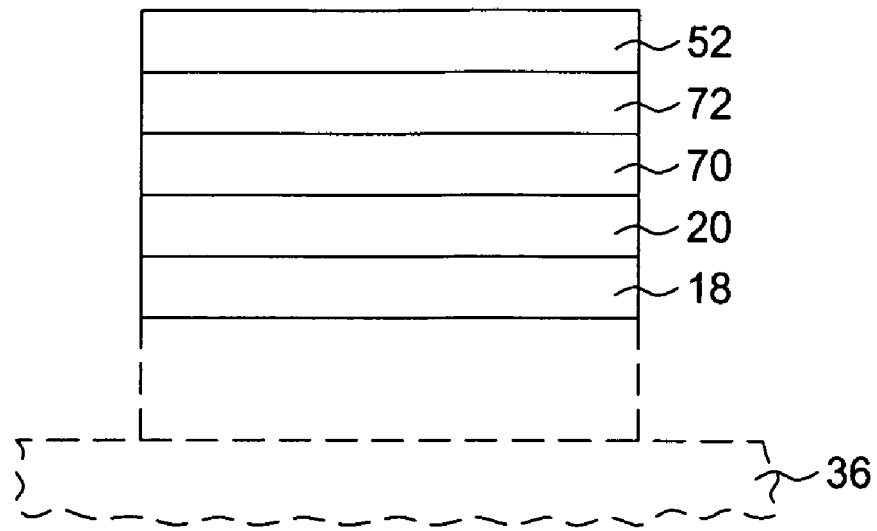
FIGS. 2 and 3 are partial views of the device shown in FIG. 1 but illustrating modifications in accordance with second and third respective embodiments of the invention.

In another embodiment, only partially shown in FIG. 2, the sapphire layer 60 shown in FIG. 1 (on a stack of previously known dielectric material pairs, e.g., the aforementioned layers 18 of cryolite and layers 20 of zinc sulfide) is replaced with a pair of dielectric layers 70 and 72 performing the same optical functions as all the other pairs of layers 18 and 20. The layer 72 is of tin oxide and, similarly as the upper layers 20 of each pair of layers 18 and 20, is of higher refractive index [$n=2.28-0.0003\times(\lambda-700)$; where $\lambda$ is the light wavelength in nanometers] than its contiguous layer 70 of, e.g., cryolite. Other suitable known materials having refractive indices lower than that of tin oxide are, for example, cryolite, silicon dioxide and magnesium fluoride. In this embodiment, a metal capping layer 52 is disposed directly on the surface 74 of the tin oxide layer 72. A layer of sapphire between the tin oxide layer 72 and the metal capping layer 52 (such as the layer 60 on the stack 50 shown in FIG. 1) is not used nor even desirable; the adherence between the metal capping layer 52 and the tin oxide layer 72 of the FIG. 2 embodiment is superior to the adherence of the metal capping layer 52 to the sapphire layer 60 in the FIG. 1 embodiment.

Figure 3:
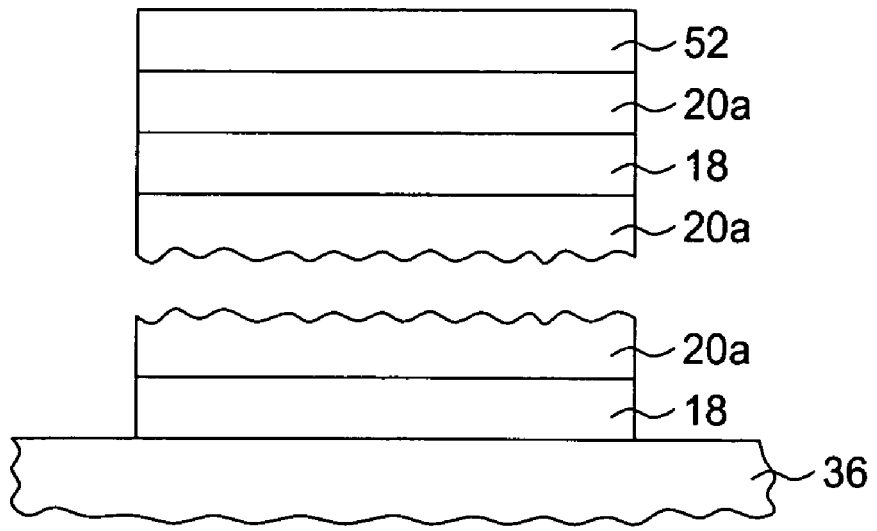

In a third embodiment, only partially shown in FIG. 3, a layer 20a of tin oxide is used as the higher refractive index material in all the dielectric material layer pairs of the stack. By way of example, and in comparison with the stack 50 shown in FIG. 1, the layers 20 in FIG. 1 are replaced with layers 20a of tin oxide while the layers 18 remain cryolite. As in the FIG. 2 embodiment, however, a layer of sapphire is not used and the capping layer 52 is directly contiguous with the top-most layer 20a of the stack. Also, other low refractive index materials can be used for the layers 18.

What is claimed is:

1. In a surface emitting laser, an upper mirror structure comprising a stack of dielectric layers of alternating high and low indices of refraction capped with a layer of metal, the improvement comprising a layer consisting of tin oxide to which the metal capping layer is directly adhered for improving adhesion of the metal capping layer to the stack of dielectric layers, the upper mirror structure disposed over a light emitting structure and a lower mirror structure.

2. The surface emitting laser according to claim 1 wherein said tin oxide layer is disposed at an end of a stack comprising an integral number of pairs of dielectric layers.

3. The surface emitting laser according to claim 2 wherein all of said stack layers other than said end layer of tin oxide are of materials other than tin oxide.

4. The surface emitting laser according to claim 2 wherein said tin oxide layer is one layer of a pair of dielectric layers disposed at said stack end.

5. In a surface emitting laser, an upper mirror structure comprising a stack of dielectric layers of alternating high and low indices of refraction capped with a layer of metal, the improvement comprising a layer consisting of tin oxide to which the metal capping layer is directly adhered for improving adhesion of the metal capping layer to the stack of dielectric layers, said tin oxide layer being disposed at an end of a stack comprising an integral number of pairs of dielectric layers, said tin oxide layer being one layer of a pair of dielectric layers disposed at said stack end, all of said dielectric pairs comprising a layer of tin oxide; and the upper mirror structure disposed over a light emitting structure and a lower mirror structure.

6. The surface emitting laser according to claim 1 wherein said layer of metal comprises a continuous uninterrupted end surface of said mirror for preventing light transmission from the mirror in a direction through the stack layers through said mirror end surface.

7. In a surface emitting laser, an upper mirror structure comprising a stack of dielectric layers of alternating high and low indices of refraction capped with a layer of metal, the improvement comprising a layer consisting of tin oxide to which the metal capping layer is directly adhered for improving adhesion of the metal capping layer to the stack of dielectric layers, said tin oxide layer being disposed at an end of a stack comprising an integral number of pairs of dielectric layers, said tin oxide layer being one layer of a first pair of dielectric layers disposed at said stack end, and all of said dielectric layers other than said one layer of said first pair of dielectric layers being of materials other than tin oxides the upper mirror structure disposed over a light emitting structure and a lower mirror structure.

8. The surface emitting laser according to claim 1 wherein said metal is of gold.

9. The surface emitting laser according to claim 7 wherein said metal is of gold.

10. The surface emitting laser according to claim 1 wherein said metal layer provides an exposed and uncovered outer layer of said stack.

11. The surface emitting laser according to claim 7 wherein said metal layer provides an exposed and uncovered outer layer of said stack.

* * * * *